United States Patent [19]

Bonaccio et al.

[11] Patent Number: 5,894,239
[45] Date of Patent: Apr. 13, 1999

[54] SINGLE SHOT WITH PULSE WIDTH CONTROLLED BY REFERENCE OSCILLATOR

[75] Inventors: Anthony R. Bonaccio, Shelburne; Kirk W. Lang, Williston, both of Vt.

[73] Assignee: International Business Machines Corporation, Armonk, N.Y.

[21] Appl. No.: 08/844,082

[22] Filed: Apr. 18, 1997

[51] Int. Cl.$^6$ .................................................. H03K 7/08
[52] U.S. Cl. ............................ 327/176; 327/157; 327/159
[58] Field of Search ................................. 327/172–176, 327/156, 157, 159, 227, 230; 375/374–376; 331/1 A, 17, 25

[56] References Cited

U.S. PATENT DOCUMENTS

| | | | |
|---|---|---|---|
| 3,591,858 | 7/1971 | Boyd et al. | 327/102 |
| 3,596,200 | 7/1971 | Fausey, Jr. et al. | 327/172 |
| 3,614,632 | 10/1971 | Leibowitz et al. | 377/110 |
| 3,651,343 | 3/1972 | Monpetit | 327/172 |
| 3,673,559 | 6/1972 | Schwartz | 327/31 |
| 3,731,206 | 5/1973 | Veale | 327/172 |
| 4,465,977 | 8/1984 | Lopez de Romana | 327/20 |
| 4,484,145 | 11/1984 | Haulin | 330/9 |
| 4,580,065 | 4/1986 | Haque | 327/175 |
| 4,829,258 | 5/1989 | Volk et al. | 327/157 |
| 4,891,828 | 1/1990 | Kawazoe | 377/114 |
| 4,999,527 | 3/1991 | Gontowski | 327/229 |
| 5,045,813 | 9/1991 | Yamashita et al. | 331/16 |
| 5,170,333 | 12/1992 | Niwayama | 363/21 |
| 5,481,214 | 1/1996 | Tamaki et al. | 327/172 |

*Primary Examiner*—Kenneth B. Wells
*Attorney, Agent, or Firm*—Whitham, Curtis, Whitham; Eugene I. Shkurko

[57] ABSTRACT

A one-shot structure for controlling pulse widths on integrated circuit chips by using a reference oscillator to compensate the rate at which a capacitor is discharged through a transistor in a reference pulse generator. Compensation is accomplished by using a feedback circuit to control the voltage applied to the transistor in the reference pulse generator. The reference oscillator is used with the reference pulse generator to generate a control voltage which matches the reference pulse to the reference oscillator. The same control voltage is then applied to a desired pulse generator. The desired pulse generator has the same one-shot structure as the reference pulse generator, namely a capacitor and a discharge transistor. The pulse width of the desired pulse generator is determined by scaling the geometry of the capacitor and the discharge transistor in the desired pulse generator relative to the geometry of the corresponding components in the reference pulse generator. These relative geometries remain consistent within relatively small tolerances for a chip in a typical integrated circuit process, compared to relatively large variances between design values and absolute chip geometries.

12 Claims, 4 Drawing Sheets

REFERENCE SIGNAL AND CONTROL VOLTAGE GENERATORS

REFERENCE OSCILLATOR CONTROLLED SINGLE SHOT

REFERENCE SIGNAL AND CONTROL VOLTAGE GENERATORS

DESIRED SIGNAL GENERATOR

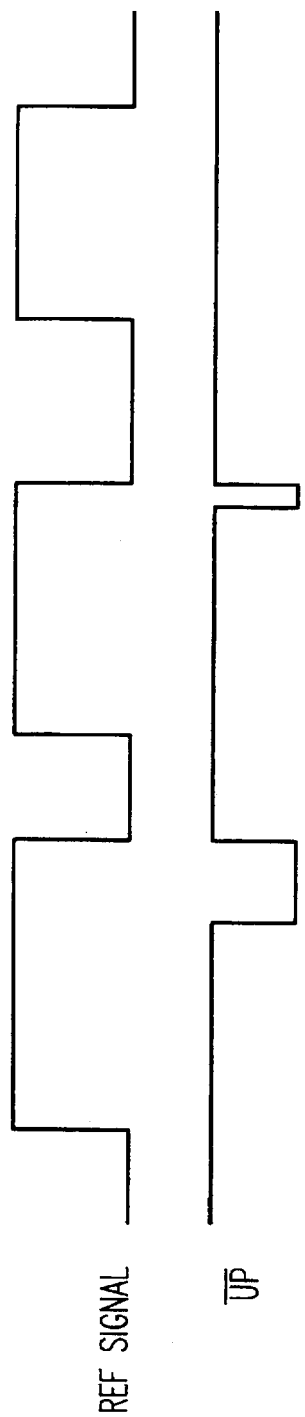
FIG. 4A REFERENCE OSCILLATOR
FIG. 4B REF SIGNAL
FIG. 4C $\overline{UP}$
FIG. 4D Vcntl
FIG. 4E INPUT SIGNAL
FIG. 4F OUTPUT SIGNAL
TIME

SINGLE SHOT WITH PULSE WIDTH CONTROLLED BY REFERENCE OSCILLATOR

BACKGROUND OF THE INVENTION

1. Field of the invention

The present invention generally relates to single shot structures for generating electrical pulses, and in particular for generating pulses having a desired width.

2. Background Description

It is often necessary to produce a pulse with a given width based on an input to a single shot structure. The width is commonly controlled by discharging a capacitor C with a known current I. To first order, the time will be proportional to the C/I ratio. However, it is very difficult to accurately control the absolute value of on-chip capacitors or currents, hence there is large variability in the resultant pulse width.

In general, circuits for producing pulses of specified widths are well known in the art. However, semiconductor manufacturing processes do not permit the values of specific circuit components to be controlled precisely. One attempt to address this problem is described in U.S. Pat. No. 4,580,065 to Haque. Haque discloses a circuit fabricated as an integrated circuit and which uses analog feedback and voltage references to obtain a constant duty cycle. The Haque patent generates positive and negative voltage references on-chip having a ratio proportional to the desired duty cycle, and requires a connection to an off-chip capacitor. The disclosed circuit controls the duty cycle of a periodic pulse, not the width of a single shot event.

SUMMARY OF THE INVENTION

It is therefore an object of the present invention to control the width of a pulse from a single shot structure in an integrated circuit where it is very difficult to achieve manufacturing control of the absolute value of on-chip capacitors or current.

It is another object of the invention to minimize post manufacturing adjustments in controlling single shot pulse width in an integrated circuit.

The present invention achieves pulse s of a desired width from one-shot structures on integrated circuit chips by using a reference oscillator to comparatively compensate the discharge rate of the capacitor used in the one-shot.

Although absolute current or capacitor values are difficult to achieve, current or capacitor ratios can be controlled quite well due to the inherent on-chip matching present on integrated circuits. For example, if an integrated circuit transistor is designed with a width to length ratio (W/L) of 10/1, the absolute ratio might be anywhere from 9.8/1.2 to 10.2/0.8 in a typical IC process. This results in an absolute tolerance of almost 50%. However, two shapes on the same chip drawn the same way will have very nearly the same size. This property is "on-chip matching." Therefore, two transistors on the same chip with the same layout design will have very nearly the same ratio. For example, if a transistor designed for a width to length ratio of 10/1 has an actual W/L of 9.8/1.2 on a given chip, a nearby transistor on the same chip with the same design layout would probably have a W/L somewhere between 9.79/1.21 and 9.81/1.19, or a relative tolerance of around 2%.

Therefore, within this relatively close tolerance for components on a particular chip, a capacitor with twice the area of a reference capacitor will have twice the capacitance of the reference. A transistor with three times the width to length (W/L) ratio of a reference transistor will have three times the drain-source current, and so on. This relationship will hold for each chip manufactured in accordance with the design, even though the absolute ratio may differ from the design ratio by as much as 50%.

This regularity is used by the invention to provide for the design of single shots having desired pulse widths relative to a reference pulse circuit having a reference timing capacitor and reference discharge transistor. The invention adjusts the current in the reference circuit in order to produce a pulse width the same as the pulse width of a reference oscillator. This adjustment is accomplished by using a feedback circuit to control the voltage applied to the discharge transistor in the reference circuit. This same voltage information can then be used in another circuit on the chip to produce a pulse of any width by scaling the size of the other circuit's timing capacitor and discharge transistor.

BRIEF DESCRIPTION OF THE DRAWINGS

The foregoing and other objects, aspects and advantages will be better understood from the following detailed description of a preferred embodiment of the invention with reference to the drawings, in which:

FIGS. 4a–4f shows typical waveforms from circuits designed in accordance with the invention.

DETAILED DESCRIPTION OF A PREFERRED EMBODIMENT OF THE INVENTION

Figure 1:
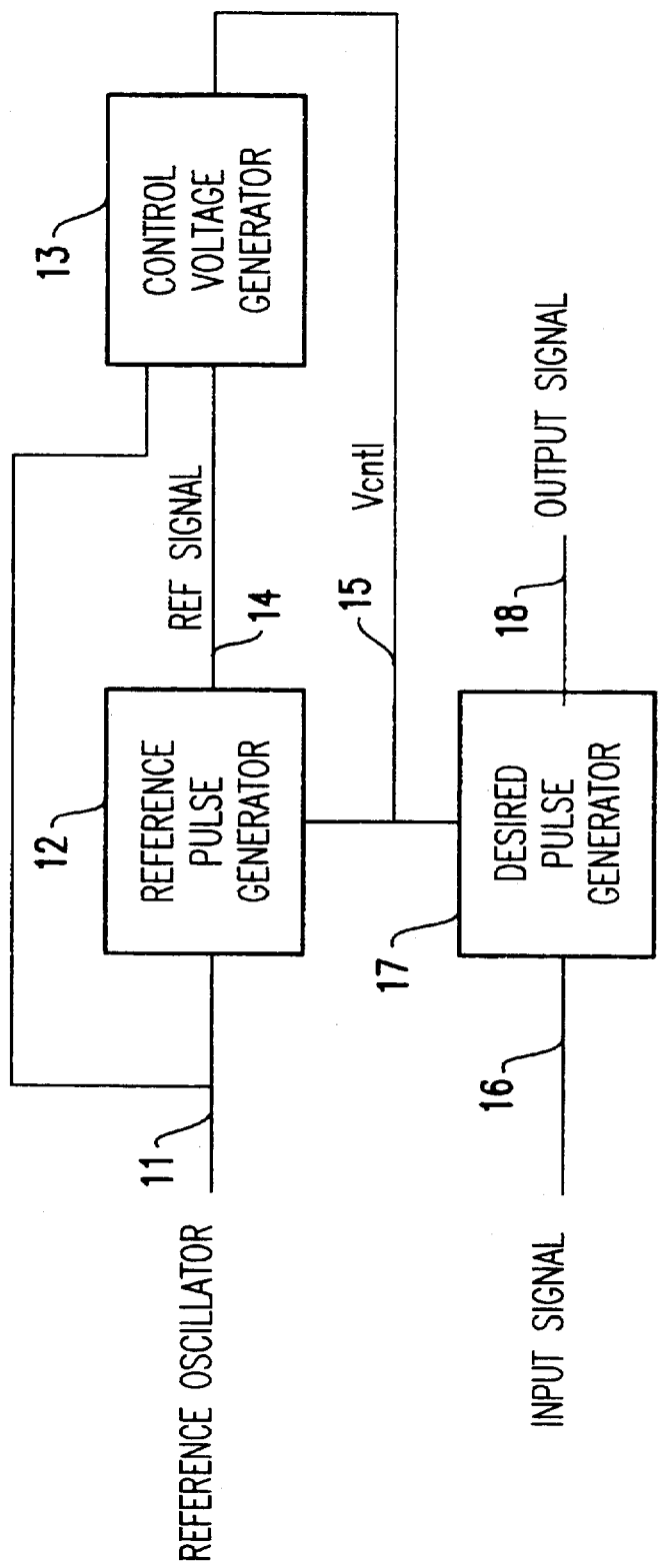
FIG. 1 is a block diagram showing operation of the invention.

Referring now to the drawings, and more particularly to FIG. 1, there is shown a block diagram of a reference oscillator controlled single shot in accordance with the invention. A reference oscillator signal at node 11 drives a reference pulse generator 12. Control voltage generator 13 compares reference oscillator signal 11 to reference signal 14 generated by reference pulse generator 12 and adjusts control voltage 15, which is fed back into reference pulse generator 12, until the width of reference signal 14 matches that of reference oscillator signal 11. Control voltage 15 is then combined with an input signal 16 by a desired pulse generator 17 to generate an output signal 18 of another width responsive to a trigger event at input signal 16. Input signal 16 has no relationship to the pulse width, phase or frequency of reference oscillator signal 11.

Figure 2:
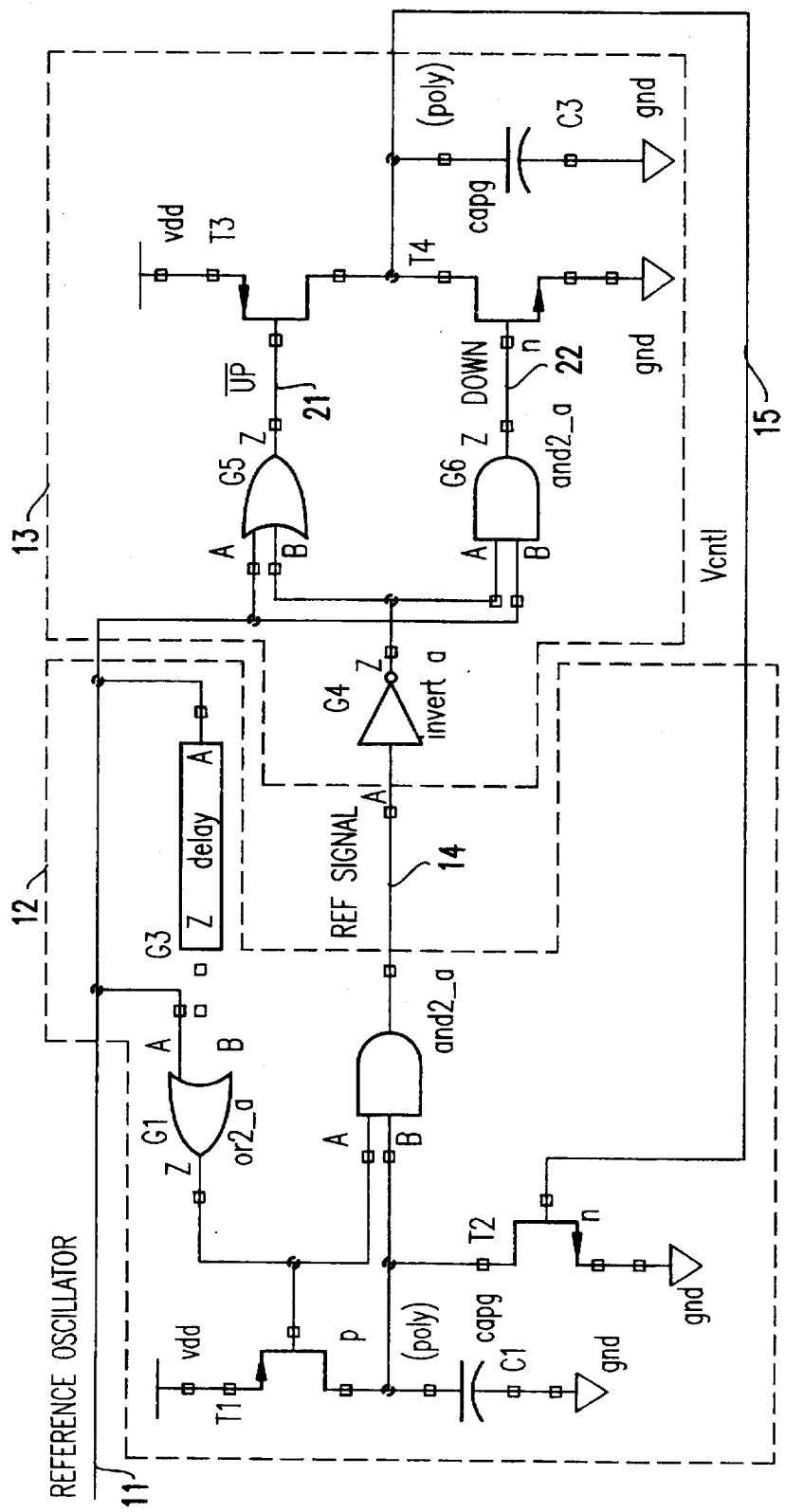
FIG. 2 is schematic of one implementation of the reference pulse and control voltage generators in accordance with the invention.

Turning now to FIG. 2, there is shown a detailed circuit schematic of reference pulse generator 12 and control voltage generator 13. When reference oscillator signal 11 is low, capacitor C1 is charged up through transistor T1. When reference oscillator signal 11 goes high, capacitor C1 will discharge through transistor T2. The rate of this discharge can be adjusted by varying control voltage 15 (Vcntl) present on the gate of transistor T2. AND gate G2 goes high when reference oscillator signal 11 goes high, and then goes low when the voltage on capacitor C1 falls below the switch point of AND gate G2. OR gate G1 and delay G3 form a pulse widening circuit, which is necessary to insure that capacitor C1 does not immediately get recharged on the falling edge of reference oscillator signal 11.

In control voltage generator 13, gates G4, G5 and G6 and transistors T3 and T4 form a simple charge pump circuit which generates control voltage 15. The output 21 of OR gate G5 is high (and therefore T3 will be off) except when both of its inputs are low. Similarly, the output 22 of AND gate G6 is low (and therefore T4 will be off) except when both its inputs are high. The inputs to both gate G5 and gate G6 are the same: reference oscillator 11 and reference pulse 14 inverted by gate G4. Thus, if reference oscillator signal 11 falls before reference signal 14 falls, transistor T3 turns on and injects charge into capacitor C3 to raise control voltage 15. This will increase the discharge current in transistor T2 and cause reference signal 14 to become narrower. If reference oscillator signal 11 falls after reference signal 14, capacitor C3 is discharged slightly through transistor T4 and reference signal 14 becomes wider. Through repetition of this differential process, control voltage 15 will eventually settle at a value that will produce a pulse with a width that matches the width of the reference oscillator.

Figure 3:
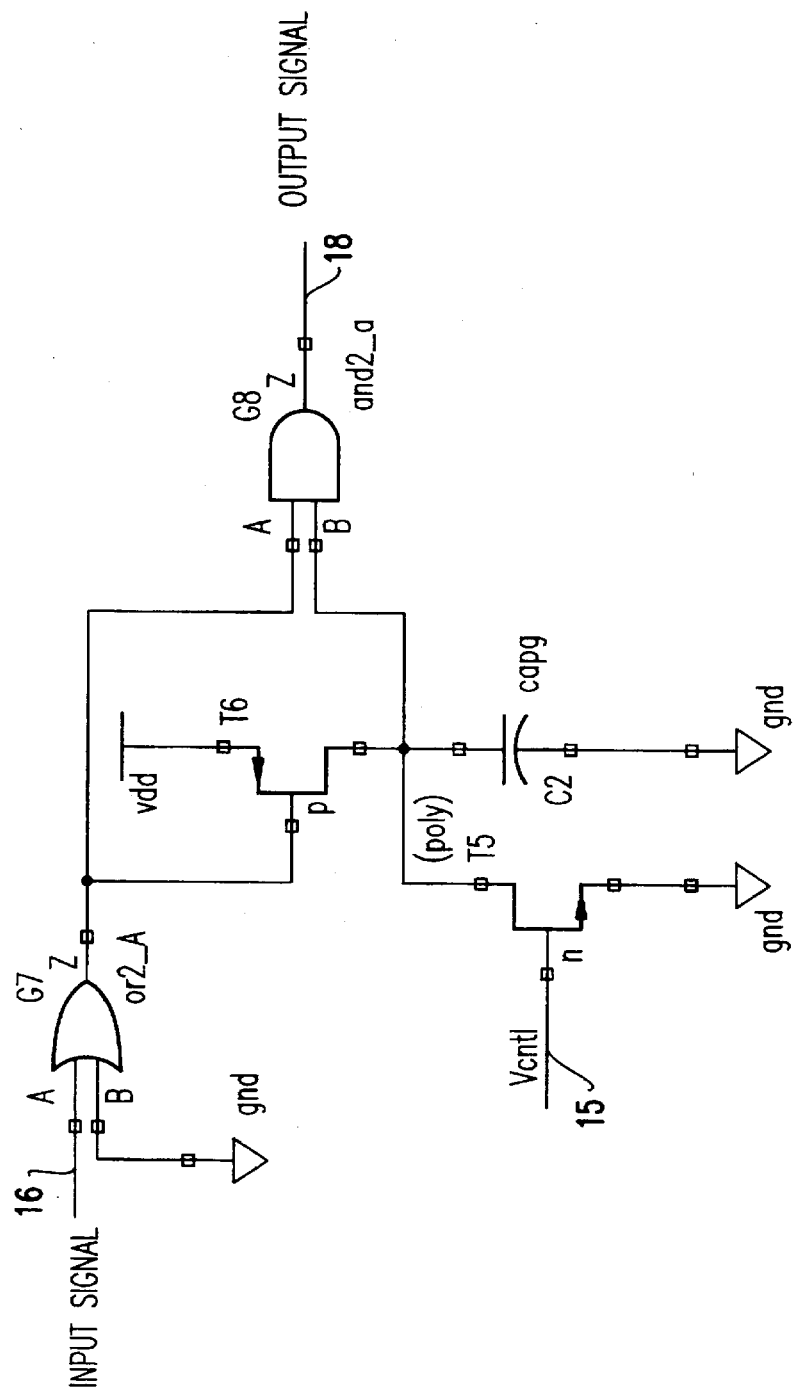
FIG. 3 is a schematic of a desired pulse generator in accordance with the invention.

FIG. 3 shows a detailed circuit implementation of desired pulse generator 17, which produces a pulse of a different width using input signal 16 as a trigger with reference to control voltage 15. The width of output signal 18 is controlled by discharging capacitor C2 through transistor T5. This signal width is a fixed factor of the reference signal width which is chosen by scaling the dimensions of capacitor C2 in the integrated circuit manufacturing process relative to capacitor C1 in reference pulse generator 12 (shown in FIG. 2), and similarly scaling the ratio of width to length of transistor T5 relative to the width to length ratio of transistor T2 in reference pulse generator 12 (shown in FIG. 2). Gates G7 and G8 are exact copies of gates G1 and G2 in reference pulse generator 12 (shown in FIG. 2) in order to minimize variation due to mismatches in these circuits. That is, gates G7 and G8 are designed with the same physical shapes as gates G1 and G2, respectively. Consequently, on any particular chip, with typical manufacturing controls, the gates and their copies will have nearly identical behaviors.

We turn now to FIG. 4, which shows typical waveforms produced from the foregoing described circuits. Waveform 4A shows several cycles of a reference oscillator signal 11. Adjustment of reference signal 14 so that it matches the reference oscillator signal 11 is shown in waveform 4B. In the example shown, the initial width of reference signal 14 is greater than that of reference oscillator signal 11, which results in an output from gate G5 in the control voltage generator 13 as shown in waveform 4C, which in turn increases the control voltage 15 as shown in waveform 4D. When the control voltage 15 is fed back into reference pulse generator 12, the width of reference signal 14 is reduced, as shown in the second cycle of waveform 4B. This cycle is repeated until the width of reference signal 14 matches the width of the reference oscillator signal 11. A similar description applies where the initial width of reference signal 14 is less than the width of reference oscillator signal 11 (example not shown). In that case there will be an output from gate G6, which will go high when reference signal 14 falls and continue high until reference oscillator signal 11 falls.

In some cases, it may occur that the period of the reference waveform is more accurately controlled than the pulse width. In this situation, it would be advantageous to pre-process the reference oscillator signal 11 (as shown by the waveform in FIG. 4A) by dividing its frequency in half. As is well known in the art, this can be accomplished using a D-type flip flop connected in a T (toggle) configuration. The pulse width of the resultant preprocessed signal will be equal to the period of the original reference waveform, and this accurate pulse width will be matched by the width of the reference signal 14.

In accordance with the foregoing discussion it will be seen that the width of the output signal 18 is related to the width of the reference signal 14, because of the relationship between the physical dimensions of C1 and T2 in reference pulse generator 12 and C2 and T5 in desired pulse generator 17. For example, suppose that the width of the desired pulse from C2/T5 is designed and manufactured to be one quarter of the width of reference signal 14 from the operation of C1/T2. Reference signal 14 is adjusted to match reference oscillator signal 11 by applying control voltage 15 to the gate of T2. Application of control voltage 15 to desired pulse generator 17 (to the gate of T5 as shown in FIG. 3) will make a proportional adjustment in output signal 18, so that the width of output signal 18 will now be one-quarter of reference oscillator signal 11.

After the control voltage 15 has stabilized in reference to reference oscillator signal 11, the rising edge of input signal 16 (as shown in waveform 4E) will then trigger an output signal 18 (as shown in waveform 4F) having the desired width relative to reference oscillator signal 11.

While the invention has been described in terms of its preferred embodiments, those skilled in the art will recognize that the invention can be practiced with modification within the spirit and scope of the appended claims.

Having thus described our invention, what we claim as new and desire to secure by Letters Patent is as follows:

1. A circuit for generating an output signal having a single-shot pulse with a desired time duration, said duration controlled by a reference oscillator signal, said reference oscillator signal having a pulse width and a period, comprising:

a reference signal said reference signal having a pulse width;

means for matching said reference signal pulse width to said reference oscillator signal pulse width; and means for generating said output signal having a single-shot pulse whose width is related to the pulse width of said reference signal by a fixed factor, said output signal being triggered by an output signal, wherein said input signal has no pulse width, phase or frequency relationship to said reference oscillator signal.

2. The circuit of claim 1, wherein said matching means comprises:

means for triggering said reference signal with said reference oscillator signal;

means for comparing said reference signal to said reference oscillator signal; and means for changing a control voltage if said pulse width of said reference signal is different from said pulse width of said reference oscillator signal, wherein said pulse width of said reference signal is differentially controlled by said control voltage.

3. The circuit of claim 2, wherein the pulse width of the reference signal and the pulse width of the output signal are created in an integrated circuit by respective one-shot structures, said one-shot structures having relative physical geometries on said integrated circuit which establish said fixed factor, said one-shot structures both being controlled by said control voltage.

4. The circuit of claim 3, wherein said comparing means comprises:

first comparator means for signaling when said reference oscillator signal falls before said reference signal; and second comparator means for signaling when said reference oscillator signal falls after said reference signal.

5. The circuit of claim 4, wherein said control voltage changing means comprises:

means for charging a control capacitor responsive to said signaling from said first comparator means; and means for discharging said control capacitor responsive to said signaling from said second comparator means, wherein said control voltage is driven by a charge on said control capacitor.

6. The circuit of claim 1, wherein said matching comprises:

means for generating said reference signal pulse width, responsive to said reference oscillator signal pulse width; and means for generating a control voltage, responsive to said reference oscillator signal pulse width and said reference signal pulse width, wherein said reference signal pulse width is differentially controlled by said control voltage.

7. The circuit of claim 3, wherein each said one-shot structure comprises:

means for charging a capacitor when a triggering signal is less than a first threshold value;

means for discharging said capacitor responsive to a rising edge of said triggering signal, said discharge being at a rate controlled by said control voltage, wherein a voltage across said capacitor is measured at a charge node; and means for gating said triggering signal and said charge node voltage to produce said single-shot pulse, said single shot pulse rising when said triggering signal is higher than a second threshold value and falling when said charge node voltage falls below a switch point of said gating means, wherein said triggering signal for said reference signal generating one-shot structure is said reference oscillator signal and said triggering signal for said one-shot structure generating the output signal is said input signal.

8. The circuit of claim 7, wherein said charging means comprises:

a PFET whose source is connected to a supply voltage, whose drain is connected to said charge node and whose gate is driven by said triggering signal; and a capacitor connected between said charge node and ground;

and wherein said discharging means comprises:

an NFET whose source is connected to ground, whose drain is connected to said charge node, and whose gate is driven by said control voltage;

and wherein said gating means is an AND gate.

9. The circuit of claim 8, wherein said triggering means comprises:

a delay gate for delaying said reference oscillator signal, said delay gate having an input and an output;

an OR gate having first and second inputs and an output, said first input being said reference oscillator signal and said second input being said output of said delay gate;

wherein said output of said OR gate is an input to said AND gate.

10. The circuit of claim 3, wherein said comparing means comprises a charge pump for generating said control voltage.

11. The circuit of claim 10, wherein said charge pump comprises:

a gate for inverting said reference pulse;

an UP gate and a DOWN gate, respectively, each having an output and each having said reference oscillator signal and said inverted reference pulse as inputs, said UP gate output being low when said inputs are both low and being high otherwise, said DOWN gate output being high when said inputs are both high and being low otherwise;

an UP gate switch and a DOWN gate switch, said UP gate switch charging a control capacitor when said UP gate output is low and being off otherwise and said DOWN gate switch discharging said control capacitor when said DOWN gate output is high and being off otherwise;

wherein said control voltage is responsive to the charge on said control capacitor.

12. The circuit of claim 11, wherein said UP gate is an OR gate, said DOWN gate is an AND gate, said UP gate switch is a PFET having a gate, a source, and a drain, and said DOWN gate switch is an NFET having a gate, a source, and a drain, said UP gate output being connected to said PFET gate, said DOWN gate output being connected to said NFET gate, said PFET source being connected to said supply voltage, said NFET source being connected to said ground, said PFET drain being connected to said NFET drain at a node of said control voltage, and said control capacitor being connected between said node of said control voltage and said ground.

* * * * *